United States Patent [19]
Kohayashi et al.

[11] Patent Number: 6,103,670
[45] Date of Patent: *Aug. 15, 2000

[54] METHOD OF MANUFACTURING OXIDE SUPERCONDUCTOR CONTAINING AG AND HAVING SUBSTANTIALLY SAME CRYSTAL ORIENTATION

[75] Inventors: Shuichi Kohayashi; Shuetsu Haseyama; Shuji Yoshizawa, all of Tokyo; Shigeo Nagaya, Nagoya, all of Japan

[73] Assignees: Dowa Mining Co., Ltd., Tokyo; Chubu Electric Power Co., Inc., Nagoya, both of Japan

[*] Notice: This patent is subject to a terminal disclaimer.

[21] Appl. No.: 09/292,825

[22] Filed: Apr. 16, 1999

Related U.S. Application Data

[62] Division of application No. 08/903,380, Jul. 30, 1997, Pat. No. 5,958,840.

[30] Foreign Application Priority Data

Aug. 2, 1996 [JP] Japan ................................ 8-205053

[51] Int. Cl.[7] ............................................. C04B 35/653
[52] U.S. Cl. .................................... 505/451; 505/729
[58] Field of Search .................... 505/451, 729, 505/779

[56] References Cited

U.S. PATENT DOCUMENTS 5,262,391  11/1993  Morita et al. ................................ 505/1
5,278,137  1/1994  Morita et al. ................................ 505/1

(List continued on next page.)

FOREIGN PATENT DOCUMENTS 05-009059  1/1993  Japan.
5-193938  8/1993  Japan.
07-033434  2/1995  Japan.

OTHER PUBLICATIONS

Murakami et al., "Melt Processing of Bulk High–Tc Superconductors . . . ", IEEE Trans. Magn. 27(2, Pt. 2), pp. 1479–1486 (Abstract).

Shimizu et al., "Effect of Ag Addition on Phase Transformation in YBCO System,"0 Adv. Supercond. VIII Proc. Int. Symp. Supercond., vol. 1, 397–400 (Abstract).

(List continued on next page.)

*Primary Examiner*—Mark Kopec
*Attorney, Agent, or Firm*—Oliff & Berridge, PLC

[57] ABSTRACT

An oxide superconductor which has high mechanical strength and exhibits favorable magnetic properties and high resistance to environment. Further, a method of manufacturing this oxide superconductor, namely, a method of manufacturing a RE—Ba—Cu—O oxide superconductor (RE is one or more kinds of rare earth elements including Y) by performing a treatment, which includes at least a burning process to be performed in a range of temperatures that are higher than the melting point of a raw material mixture containing a RE-compound raw material, a Ba-compound raw material and a Cu-compound raw material, on the aforesaid raw material mixture. This method further comprises the addition step of adding 1 to 30 in percent by weight (wt %) of Ag to the raw material mixture, and the crystallization step of melting the raw material mixture, to which Ag is added, at a temperature that is not lower than a temperature at which the raw material mixture is decomposed and fused into the $RE_2BaCuO_5$ phase and a liquid layer, and then lowering the temperature of the aforesaid raw material mixture close to a temperature, at which a $REBa_2Cu_3O_{7-x}$ phase crystallizes, and subsequently bringing a seed crystal, which meets the following condition: (the temperature at which the $REBa_2Cu_3O_{7-x}$ phase of the seed crystal)>(the temperature at which the $REBa_2Cu_3O_{7-x}$ phase of the aforesaid raw material to which Ag is added), into contact with the aforesaid raw material mixture and then performing crystallization by using this seed crystal as a starting point.

4 Claims, 2 Drawing Sheets

UNIT(°C)

| COMPOSING ELEMENTS | Nd | Sm | Eu | Gd | Dy | Y | Ho | Er | Yb |
|---|---|---|---|---|---|---|---|---|---|
| FORMATION TEMPERATURE | 1070 | 1080 | 1050 | 1030 | 1010 | 1000 | 990 | 970 | 900 |

U.S. PATENT DOCUMENTS

| | | | |
|---|---|---|---|
| 5,308,799 | 5/1994 | Morita et al. | 505/126 |
| 5,430,010 | 7/1995 | Murakami et al. | 505/450 |
| 5,496,799 | 3/1996 | Toshida et al. | 505/450 |
| 5,508,253 | 4/1996 | Morita et al. | 505/126 |
| 5,571,776 | 11/1996 | Morita et al. | 505/126 |
| 5,632,811 | 5/1997 | Namikawa et al. | 117/1 |
| 5,648,319 | 7/1997 | Morita et al. | 505/230 |
| 5,849,668 | 12/1998 | Yamaguchi et al. | 505/126 |
| 5,851,956 | 12/1998 | Namikawa et al. | 505/450 |

OTHER PUBLICATIONS

Zhou et al., "Eutectic Alignment of Yttrium Barium Copper Oxide ($YBa_2Cu_3O_{7-x}$) at 930 degree C," Key Eng. Mater. 53–55, pp. 666–669 (No Abstract).

M. Deguchi et al, "Enlargement of Ag Doped YBCO Crystal Prepared by MPMG Process".

A. Takagi et al., "Preparation and Superconducting Properties of Melt–Textured $NdBa_2Cu_3Oy$ Bulk with $Sm_2BaCuO_5$ Addition," pp. 703–706. No Pub Date/Info.

N. Hayashi et al., "Grain Enlargement in OCMG–Processed RE–Ba–Cu–O Superconductors and Their Properties," pp. 735–738. No Pub Date/Info.

S. Goshima et al., "Melt Growth and Properties of Ag–Doped Nd–Ba–Cu–O," pp. 739–742. No Pub Date/Info.

Tsukamoto et al., "Electromagnetic Properties of Y–Ba–Cu–Pt–O Superconductors," Kyushu Sangyo Daigaku Kogaleubu Kenkyo Hokoku, 29, pp. 61–68 (Abstract), 1992.

UNIT(°C)

| COMPOSING ELEMENTS | Nd | Sm | Eu | Gd | Dy | Y | Ho | Er | Yb |
|---|---|---|---|---|---|---|---|---|---|
| FORMATION TEMPERATURE | 1070 | 1080 | 1050 | 1030 | 1010 | 1000 | 990 | 970 | 900 |

UNIT($\times 10^4$ A/cm$^2$)

| ADDITIVE ELEMENTS | Pt | Pd | Ru | Rh | Ir | Os | Re |
|---|---|---|---|---|---|---|---|
| CRITICAL CURRENT DENSITY | 2.2 | 2.2 | 2.1 | 2.1 | 2.2 | 2.1 | 2.0 |

UNIT(kg·f)

| ADDITIVE ELEMENTS | Pt | Pd | Ru | Rh | Ir | Os | Re |
|---|---|---|---|---|---|---|---|
| MAGNETIC REPULSION FORCE | 13 | 13 | 12 | 12 | 13 | 12 | 12 |

FIG. 5

| | COMPOSING ELEMENT RE | CRITICAL TEMPERATURE (K) | CRITICAL CURRENT DENSITY ($\times 10^4 A/cm^2$) | MAGNETIC REPULSION FORCE (kg·f) |
|---|---|---|---|---|
| EXAMPLE 1 | Y | 90 | 2.2 | 13 |
| EXAMPLE 2 | Sm | 92 | 2.5 | 14 |
| EXAMPLE 3 | Sm | 92 | 2.5 | 14 |
| EXAMPLE 4 | Nd | 94 | 2.6 | 14 |
| COMPARATIVE EXAMPLE 1 | Y | 90 | 1.7 | 9 |
| COMPARATIVE EXAMPLE 2 | Sm | 92 | 2.0 | 5 |

METHOD OF MANUFACTURING OXIDE SUPERCONDUCTOR CONTAINING AG AND HAVING SUBSTANTIALLY SAME CRYSTAL ORIENTATION

This is a Division of application Ser. No. 08/903,380 filed Jul. 30, 1997 now U.S. Pat. No. 5,958,840. The entire disclosure of the prior application(s) is hereby incorporated by reference herein in its entirety.

BACKGROUND OF THE INVENTION

1. Field of the Invention

The present invention relates to an oxide superconductor which excels at magnetic properties, mechanical strength and resistance to environment, and to a method of manufacturing such an oxide superconductor. Further, the present invention is applicable to, for example, a current lead, magnetic bearings, a magnetic shielding and a bulk magnet.

2. Description of the Related Art

Hitherto, there has been known a conventional method of manufacturing such a kind of an oxide superconductor (see Japanese Unexamined Patent Publication (Kokai) No. Hei 5-193938/1993 Official Gazette), by which a RE—Ba—Cu—O oxide superconductor (incidentally, RE denotes one or more kinds of rare earth elements including Y) is manufactured by bringing a seed crystal into contact with a raw material mixture, which contains a RE compound, a Ba compound and a Cu compound, and causing the growth of a crystal from the seed crystal after the heating of the raw material mixture to a temperature, which is not lower than the melting point thereof, and the melting thereof.

In the case of the conventional method described in this Official Gazette, a single crystal of a $REBa_2Cu_3O_{7-X}$ phase (hereunder sometimes referred to as a "123 phase") is used as a seed crystal. In accordance with this conventional method, crystal growth from the seed crystal is enabled by using one or more RE elements composing the "123 phase" of a superconductor to be produced, which are different from those of the seed crystal, and selecting one of the combinations of such RE elements in such a manner that the "123 phase" formation or forming temperature of the seed crystal is higher than the "123 phase" formation temperature of the superconductor to be produced.

However, in the case of the aforementioned manufacturing method, it is necessary to select RE elements in such a way that the "123 phase" formation temperature of the seed crystal is higher than the "123 phase" formation temperature of the superconductor to be manufactured. This is because of the fact that after crystallization, lattice contraction occurs in the material of this seed crystal owing to the increasing or reducing of oxygen (content) and microcracks extending in a direction perpendicular to the c-axis are produced. It is difficult to cut an elongated seed crystal therefrom and the seed crystal melts unless there is established a large difference in crystallization temperature between the seed crystal and the superconductor to be produced. As an inevitable consequence, this conventional method cannot be applied to the case of manufacturing a superconductor that employs a RE element, which has the highest "123 phase" formation temperature, as a composing element. This is because no seed crystal having the "123 phase", whose formation temperature is higher than the highest "123 phase" formation temperature of such a superconductor, can be prepared.

Moreover, even in the case of manufacturing a superconductor that employs a RE element, which has the highest "123 phase" formation temperature, as a composing element, the difference in the formation temperature between the seed crystal and the superconductor is small, so that the advantageous effect of this conventional method utilizing the difference in the formation temperature therebetween is not obtained.

The present invention is accomplished to solve the aforementioned problem of the conventional method.

SUMMARY OF THE INVENTION

Accordingly, an object of the present invention is to enable the application of a superconductor manufacturing method, which uses a seed crystal, even in the case that the "123 phase" formation temperature is relatively high, thereby providing an oxide superconductor that excels at magnetic properties and is highly oriented.

To achieve the foregoing objects, in accordance with an aspect of the present invention, there is provided an oxide superconductor (hereunder sometimes referred to as a first oxide superconductor of the present invention) in which fine particles (or grains) of a $RE_2BaCuO_5$ phase (RE is one or more kinds of rare earth elements including Y) are dispersed in each crystal of a $REBa_2Cu_3O_{7-X}$ phase. In the first oxide superconductor of the present invention, the difference in crystal orientation between each pair of adjacent crystals contained in a region, which is 20 mm long and is 20 mm wide and is 2 mm thick, is within a range of (−5°) to (+5°). Moreover, the $REBa_2Cu_3O_{7-X}$ phase contains 1 to 30 in percent by weight (wt %) of Ag. Alternatively, the $REBa_2Cu_3O_{7-X}$ phase contains a compound that includes 1 to 30 wt % of Ag. Incidentally, this applies to every similar case which will be described hereinbelow.

In the case of an embodiment (hereunder sometimes referred to as a second oxide superconductor of the present invention) of the first oxide superconductor of the present invention, the aforesaid RE is one of Sm and Nd or is a mixture of Sm and Nd.

In the case of an embodiment of the first or second oxide superconductor (hereunder sometimes referred to as a third oxide superconductor of the present invention), the third oxide superconductor of the present invention contains 0.05 to 5 in percent by weight (wt %) of one or more kinds of elements of Pt, Pd, Ru, Rh, Ir, Os and Re. Alternatively, the third oxide superconductor of the present invention contains compounds that include 0.05 to 5 wt % of one or more kinds of elements of Pt, Pd, Ru, Rh, Ir, Os and Re. Incidentally, this applies to every similar case which will be described hereinbelow.

In accordance with another aspect of the present invention, there is provided an oxide superconductor manufacturing method (hereunder sometimes referred to as a first method of the present invention) of manufacturing a RE—Ba—Cu—O oxide superconductor (RE is one or more kinds of rare earth elements including Y) by performing a treatment, which includes at least a burning process to be performed in a range of temperatures that are higher than the melting point of a raw material mixture containing a RE-compound raw material, a Ba-compound raw material and a Cu-compound raw material, on the aforesaid raw material mixture. The first method of the present invention further comprises the addition step of adding 1 to 30 in percent by weight (wt %) of Ag to the aforesaid raw material mixture, and the crystallization step of melting the aforesaid raw material mixture, to which Ag is added, at a temperature that is not lower than a temperature at which the aforesaid raw material mixture is decomposed and fused into the aforesaid $RE_2BaCuO_5$ phase and a liquid layer, and then lowering the temperature of the aforesaid raw material mixture to a temperature close to a temperature, at which a $REBa_2Cu_3O_{7-x}$ phase crystallizes, and subsequently bringing a seed crystal, which meets the following condition: (the temperature at which the $REBa_2Cu_3O_{7-x}$ phase of the seed crystal)>(the temperature at which the $REBa_2Cu_3O_{7-x}$ phase of the aforesaid raw material to which Ag is added), into contact with the aforesaid raw material mixture and then performing crystallization by using this seed crystal as a starting point.

Thus, a highly oriented crystal of an oxide superconductor, which contains fine particles of Ag dispersed therein and has high mechanical strength and favorable magnetic properties and high resistance to environment, can be obtained by using a seed crystal as a starting point.

In the case of an embodiment (hereunder sometimes referred to as a second method of the present invention) of the first method of the present invention, the aforesaid RE is one of Sm and Nd or is a mixture of Sm and Nd.

In the case of an embodiment (hereunder sometimes referred to as a third method of the present invention) of the first or second method of the present invention, 0.05 to 5 wt % of one or more kinds of elements of metals Pt, Pd, Ru, Rh, Ir, Os and Re and compounds thereof are added to the aforesaid raw material mixture.

In the case of an embodiment (hereunder sometimes referred to as a fourth method of the present invention) of the first, second or third method of the present invention, the partial pressure of oxygen $PO_2=2\times10^{-1}\sim1\times10^{-4}$ atm in the aforesaid crystallization step.

When manufacturing a RE—Ba—Cu—O oxide superconductor (RE is one or more kinds of rare earth elements including Y) by performing a treatment, which includes at least a burning process to be performed in a range of temperatures that are higher than the melting point of a raw material mixture containing a RE-compound raw material, a Ba-compound raw material and a Cu-compound raw material, on the aforesaid raw material mixture, fine particles of the $RE_2BaCuO_5$ phase, which have a mean particle diameter of 1 to 30 $\mu$m or so, are dispersed in a crystal of the $REBa_2Cu_3O_{7-x}$ phase. Consequently, the critical current can be increased.

Moreover, when fine particles of Ag are dispersed in the crystal, microcracks are reduced. Thus, the magnetic properties, the mechanical strength and the water resistance thereof are enhanced. At that time, if Ag content is less than 1 wt %, the effect thereof is low. In contrast, if more than 30 wt % of Ag is added to the raw material mixture, excessive Ag is not contained in the crystal but is deposited on a crystalline interface (or a grain boundary).

Further, the "123 phase" formation temperature of the oxide superconductor has values correspondingly to the cases of employing RE elements as composing elements, respectively, which are presented in tabular form in FIG. 2.

Moreover, the inventors of the present invention have found that when the metallic powder or the compound powder of Ag is added thereto, the "123 phase" formation temperature changes relative to that (namely, the formation temperature corresponding to the RE elements illustrated in FIG. 2) in the case of adding no Ag thereto, as illustrated in FIG. 1 regardless of the kinds of RE elements.

Thus, crystal growth from a seed crystal is caused by bringing the seed crystal into contact with the mixture at a temperature, which is slightly higher than the crystallization or crystallizing temperature correspondingly to each of the RE elements and to an amount of added Ag, and thereafter maintaining the temperature thereof at a value close to this crystallization temperature or gradually lowering the temperature thereof. Consequently, a highly oriented crystal, in which fine particles of Ag are dispersed, can be grown to a large one.

Furthermore, the difference in crystallization temperature between the crystal to be grown and a RE—Ba—Cu—O seed crystal, to which no Ag is added, can be increased by utilizing this effect, adding Ag to the crystal to be grown and lowering the crystallization temperature. Consequently, a highly oriented crystal of a RE—Ba—Cu—O seed crystal, which employs a RE element having a high "123 phase" formation temperature as composing elements thereof, can be obtained.

Additionally, when using one of Sm and Nd or using a mixture of Sm and Nd, the crystal growth rate is higher in comparison with the case of using other rare earth elements. Thus, the production cost of the superconductor can be reduced. Further, the critical temperature, at which the crystal transits to a superconductor, of the crystal employing Sm and Nd, whose ionic radii are larger than those of other rare earth elements, becomes higher. Moreover, a critical current density, which is important in applying the superconductor, is high at the side of a high magnetic field, whose strength is close to 1 T.

Incidentally, Pt sometimes gets mixed with raw materials from a platinum crucible when making the raw material mixture for forming superconductors. However, it is confirmed that similar advantageous effects can be obtained even when 0.05 to 5 wt % of Pt is contained in the raw material mixture and that an oxide superconductor having similar highly advantageous effects can be obtained even in the case where 0.05 to 5 wt % of one or more kinds of elements of metals Pt, Pd, Ru, Rh, Ir, Os and Re and compounds thereof are added to the raw material mixture.

Furthermore, it has been confirmed that rear earth element is suppressed from being replaced with a Ba site by setting the partial pressure of oxygen $PO_2=2\times10^{-1}\sim1\times10^{-4}$ atm. when performing the crystallization, and that the characteristics such as the critical current density and the critical temperature can be enhanced.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which:

FIG. 5 is a table showing the critical temperature, the critical electric current density and the magnetic repulsion force of each of superconductors manufactured as "Examples" of the present invention and "Comparative Examples".

DETAILED DESCRIPTION OF THE PREFERRED EMBODIMENTS

Figures 1, 2, 3, 4:
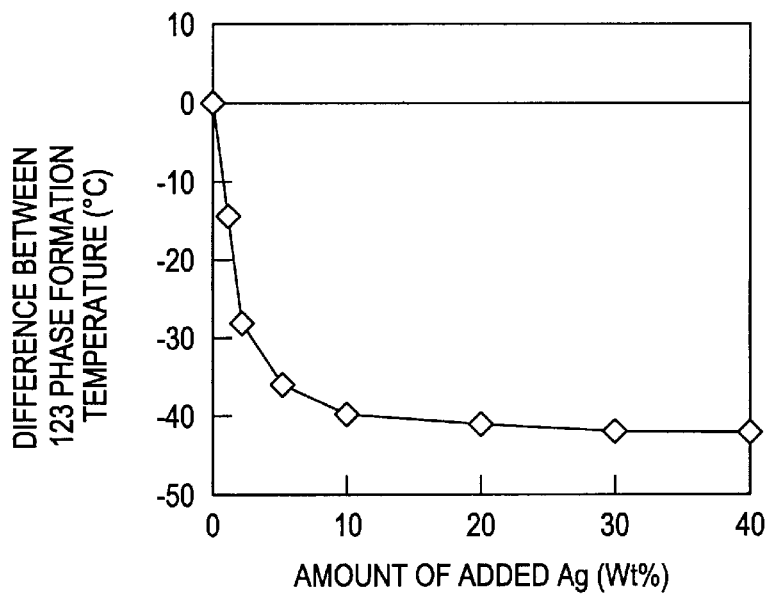
FIG. 1 is a graph showing the relation between the amount of added Ag and the formation temperature at which a $REBa_2Cu_3O_{7-x}$ phase is formed.
FIG. 2 is a table showing the formation temperature of a $REBa_2Cu_3O_{7-x}$ phase in the case that one or more RE elements are employed as composing elements.
FIG. 3 is a table showing the critical electric current density of each of superconductors manufactured by adding Pt, Pd, Ru, Rh, Ir, Os and Re to the material thereof. respectively, in "Example 1"
FIG. 4 is a table showing the magnetic repulsion force of each of superconductors manufactured by adding Pt, Pd, Ru, Rh, Ir, Os and Re to the material thereof, respectively, in "Example 1"

Hereinafter, the present invention will be described in detail with reference to the following examples.

EXAMPLE 1

In the case of this example, briefly, Y was used as RE of the RE compound composing a raw material mixture for forming an oxide superconductor. Further, 0.5 wt % of each of the following kinds of metallic powder, namely, each of Pt powder, Pd powder, Ru powder, Rh powder, Ir powder, Os powder and Re powder was added to and mixed with a raw material mixture. Then, crystallization was performed at the partial pressure of oxygen $PO_2=2\times10^{-1}$ atm by further adding 10 wt % of Ag powder to the raw material mixture.

First, powdery raw materials, namely, $Y_2O_3$ powder, $BaCO_3$ powder and CuO powder were weighed so that the composition ratio Y:Ba:Cu was 20:25:35. Moreover, each of the following kinds of metallic power, namely, Pt powder, Pd powder, Ru powder, Rh powder, Ir powder, Os powder and Re powder was added separately to and mixed with a corresponding raw material mixture as herein-above described. Subsequently, 10 hours were spent in raising the temperature of each of these powdery mixtures from room temperature to 800° C. in the air. Then, such powdery mixtures were maintained for 30 hours. Thereafter, 10 hours were further spent in lowering the temperature of the powdery mixtures to room temperature at which these powdery mixtures underwent calcining. Subsequently, 10 wt % of Ag powder, whose mean particle diameter was about 1 μm, was added to each of such calcined powdery mixtures. Then, each of such powdery mixtures was mixed with the Ag powder and was further pulverized by using a pot mill, so that the mean particle diameter of the obtained powdery mixtures was about 20 μm. Subsequently, each of the pulverized powdery mixtures was press-molded into a disk-like compact which was 50 mm in outer or outside diameter and was 20 mm in thickness and was a raw material mixture for forming a superconductor.

Next, this compact was put on an alumina substrate or board and was then put into a semi-melted state by being heated to a temperature of 1130° C. at the partial pressure of oxygen $PO_2=2\times10^{-1}$ atm in the air. Thereafter, the temperature of the compacts was lowered to a temperature of 900° C. at a rate of 10° C./hr by vertically imposing a temperature gradient of 5° C./cm onto each of the compacts in such a way that the upper part of each of the compacts was at a lower temperature side. Then, a preliminarily produced seed crystal, which contained no Ag and was obtained by dispersing particles of a $Y_2BaCuO_5$ phase in a $YBa_2Cu_3O_{7-X}$ phase in a composition ratio of the former to the latter=1:0.4, was brought into contact with an upper part of each of the compacts in such a manner that the direction of growth of the seed crystal was parallel with the c-axis. Next, the temperature of the compact was gradually lowered at a rate of 1° C./hr to a temperature of 850° C. Furthermore, the temperature of the compacts was lowered at a rate of 1° C. hr to room temperature. Thus, the crystallization was performed.

Subsequently, the crystallized compact was placed in a furnace being capable of performing inert gas replacement. Then, the inner pressure of the furnace was reduced by a rotary pump to a pressure of 0.1 Torr. Thence, oxygen gas was poured into the furnace, so that the inner pressure of the furnace was equal to an atmospheric pressure and that the partial pressure of oxygen was 95% or more of the inner pressure of the furnace. Thereafter, the temperature in the furnace was raised from room temperature to a temperature of 600° C. over a time period of 10 hours, during which oxygen gas was simultaneously poured into the furnace at a flow rate of 0.5 L/min. Thereafter, a time period of 100 hours was required to gradually lower the temperature in the furnace from 600° C. to 300° C. Thus, a sample of a superconductor was produced.

Then, the sample of the superconductor, which was obtained in the aforementioned manner, was cut. Further, when a section of the sample was observed by using a scanning electron microscope, it was found that few microcracks were caused, that fine particles of the $Y_2BaCuO_5$ phase, which had particle diameters of 0.1 to 30 μm, were dispersed in a crystal of the $YBa_2Cu_3O_{7-X}$ phase, and that Ag particles of diameters ranging from 0.1 to 100 μm were dispersed in the sample. Furthermore, it was found that the entire sample reflected the seed crystal and was oriented in the direction of the c-axis, that the difference in crystal orientation between each pair of adjacent crystals was within a range of (−5°) to (+5°) and that this superconductor sample was substantially single crystal.

Further, when the critical temperature (Tc) of each of the disk-like oxide superconductive samples, to which Pt, Pd, Ru, Rh, Ir, Os and Re were respectively added, was measured at a temperature of 77 [K], the obtained value thereof was 90 K regardless of the kinds of the added elements.

Further, the critical current density (Jc) of each of the disk-like oxide superconductive samples, to which Pt, Pd, Ru, Rh, Ir, Os and Re were respectively added, was measured at a temperature of 77 [K] in an external magnetic field 1 [T]. FIG. 3 shows values of the critical current density (Jc), which were measured at that time. As shown in FIG. 3, the critical current densities respectively corresponding to the superconductive samples have high values because occurrence of microcracks were suppressed.

Moreover, the magnetic repulsion force of each of the disk-like superconductive samples, to which Pt, Pd, Ru, Rh, Ir, Os and Re were respectively added, onto a magnet (that had the maximum surface magnetic flux density of 0.53 [T] and had an outside diameter of 25 mm and was 50 mm in thickness), which is an important feature for application thereof, was measured. Consequently, it was found that the samples exhibited strong magnetic repulsion force characteristics as shown in FIG. 4 in the case where the measurement temperature was 77 [K] and the (measurement) interval was 0.1 mm.

Furthermore, for the purpose of making comparisons among the critical temperatures, the critical current densities and the magnetic repulsion forces of embodiments (namely, Examples) of the present invention and of comparative examples, the measured values of those of Example 1 are shown in FIG. 5. Incidentally, the values corresponding to "Example 1" were obtained in the case that Pt, Pd and Ir were added to the samples thereof, respectively.

EXAMPLE 2

In the case of this example, briefly, Sm was used as RE of the RE compound composing a raw material mixture for forming an oxide superconductor. Further, crystallization was performed at the partial pressure of oxygen $PO_2=1\times10^{-2}$ atm by further adding 10 wt % of Ag powder to the raw material mixture.

First, powdery raw materials, namely, $Sm_2O_3$ powder. $BaCO_3$ powder and CuO powder were weighed so that the composition ratio Sm:Ba:Cu was 18:24:34. Then, only $BaCO_3$ powder and CuO powder were burned in a platinum crucible at a temperature of 950° C. for two hours. Thus, calcined powder containing $BaCuO_2$ and CuO was obtained (in a mole ratio of $BaCuO_2$ to CuO, which was 24:10). Subsequently, this calcined powder was pulverized by using a pot mill, so that the mean particle diameter was about 2 $\mu$m. Then, the pulverized powder was mixed with $Sm_2O_3$ powder that was preliminarily weighted and had a mean particle diameter of about 1 mm. Further, 10 wt % of Ag powder, whose mean particle diameter of 1 $\mu$m, was added to and mixed with the pulverized powder. Subsequently, this pulverized mixture powder was press-molded into a disk-like compact which was 50 mm in outer diameter and was 20 mm in thickness and was a raw material mixture for forming a superconductor.

Next, this compact was put on an alumina substrate and was then put into a semi-melted state by being heated to a temperature (zone) of 1150° C. at the partial pressure of oxygen $PO_2=2\times10^{-2}$ atm in the air. Thereafter, the temperature of the compacts was lowered to a temperature of 1020° C. at a rate of 10° C./min by vertically imposing a temperature gradient of 5° C./cm onto each of the compacts in such a way that the upper part of each of the compacts was at a lower temperature side. Then, a preliminarily produced seed crystal, which contained no Ag and was obtained by dispersing particles of a $Nd_1Ba_2Cu_2O_{10}$ phase in a $NdBa_2Cu_3O_{7-x}$ phase in a composition ratio of the former to the latter=1:0.2, was brought into contact with an upper part of each of the compacts in such a manner that the direction of growth of the seed crystal was parallel with the c-axis. Next, the temperature of the compact was gradually lowered at a rate of 1° C./hr to a temperature of 900° C. Furthermore, the temperature of the compacts was lowered at a rate of 1° C./hr to room temperature. Thus, the crystallization was performed.

Subsequently, the crystallized compact was placed in a furnace being capable of performing inert gas replacement. Then, the inner pressure of the furnace was reduced by a rotary pump to a pressure of 0.1 Torr. Thence, oxygen gas was poured into the furnace, so that the inner pressure of the furnace was equal to an atmospheric pressure and that the partial pressure of oxygen was 95% or more of the inner pressure of the furnace. Thereafter, the temperature in the furnace was raised from room temperature to a temperature of 600° C. over a time period of 10 hours, during which oxygen gas was simultaneously poured into the furnace at a flow rate of 0.5 L/min. Thereafter, a time period of 200 hours was required to gradually lower the temperature in the furnace from 600° C. to 300° C. Moreover, a time period of 10 hours was spent in lowering the temperature in the furnace from 300° C. to room temperature. Thus, a sample of a superconductor was produced.

Then, the sample of the superconductor, which was obtained in the aforementioned manner, was cut. Further, when a section of the sample was observed by using a scanning electron microscope, it was found that few microcracks were caused, that fine particles of the $Sm_2BaCuO_5$ phase, which had particle diameters of 0.1 to 30 $\mu$m, were dispersed in a crystal of the $SmBa_2Cu_3O_{7-x}$ phase, and that Ag particles of diameters ranging from 0.1 to 100 $\mu$m were dispersed in the sample. Furthermore, it was found that the entire sample reflected the seed crystal and was oriented in the direction of the c-axis, that the difference in crystal orientation between each pair of adjacent crystals was within a range of (−5°) to (+5°) and that this superconductor sample was substantially single crystal.

Further, when the critical temperature (Tc) of each of the obtained superconductive samples was measured, the obtained value thereof was 92 K.

Furthermore, when the critical current density (Jc) of each of the superconductive samples was measured at a temperature of 77 [K] in an external magnetic field 1 [T], the measurement value was $2.5\times10^4$ $A/cm^2$.

Moreover, the magnetic repulsion force of each of the superconductive samples onto a magnet (that had the maximum surface magnetic flux density of 0.53 [T] and had an outside diameter of 25 mm and was 50 mm in thickness), which is an important feature for application thereof, was measured. Consequently, it was found that the samples exhibited strong magnetic repulsion force (characteristics) of 14 Kg.f in the case where the measurement temperature was 77 [K] and the (measurement) interval was 0.1 mm. Furthermore, results of the measurement of the critical temperature, the critical current density and the magnetic repulsion force of Example 2 are shown in FIG. 5.

EXAMPLE 3

In the case of this example. briefly, Sm was used as RE of the RE compound composing a raw material mixture for forming an oxide superconductor. Further, crystallization was performed at the partial pressure of oxygen $PO_2=1\times10^{-2}$ atm by further adding 20 wt % of Ag powder to the raw material mixture.

First, after powdery raw materials, namely, $Sm_2O_3$ powder, $BaCO_3$ powder and CuO powder were weighted so that the composition ratio Sm:Ba:Cu was 20:25:35, these raw materials were mixed with one another and further were molten in a platinum crucible at a temperature of 1400° C. for 30 minutes. Then, the molten materials were solidified by performing the casting thereof onto a copper plate and the quenching thereof. Subsequently, 20 wt % of Ag powder was added to this solidified or coagulated materials. Further, this solidified materials were mixed therewith and were pulverized into powder by using a pot mill, so that the mean particle diameter of the powder was about 2 $\mu$m. Next. this mixture powder was press-molded into a disk-like compact which was 50 mm in outer diameter and was 20 mm in thickness and was a raw material mixture for forming a superconductor.

Next, this compact was put on an alumina substrate and was then put into a semi-melted state by being heated to a temperature of 1150° C. at the partial pressure of oxygen $PO_2=1\times10^{-2}$ atm in the air. Thereafter, the temperature of the compacts was lowered to a temperature of 1018° C. at a rate of 10° C./min by vertically imposing a temperature gradient of 5° C./cm onto each of the compacts in such a way that the upper part of each of the compacts was at a lower temperature side. Then, a preliminarily produced seed crystal, which contained no Ag and was obtained by dispersing particles of a $Sm_2BaCuO_5$ phase in a $SmBa_2Cu_3O_{7-x}$ phase in a composition ratio of the former to the latter=1:0.4, was brought into contact with an upper part of each of the compacts in such a manner that the direction of growth of the seed crystal was parallel with the c-axis. Next, the temperature of the compact was gradually lowered at a rate of 1° C./hr to a temperature of 900° C. Furthermore. the temperature of the compacts was lowered at a rate of 10° C./hr to room temperature. Thus, the crystallization was performed.

Then, the crystallized compact was placed in a furnace being capable of performing inert gas replacement. Then, the inner pressure of the furnace was reduced by a rotary pump to a pressure of 0.1 Torr. Thence, oxygen gas was poured into the furnace, so that the inner pressure of the furnace was equal to an atmospheric pressure and that the partial pressure of oxygen was 95% or more of the inner pressure of the furnace. Thereafter, the temperature in the furnace was raised from room temperature to a temperature of 600° C. over a time period of 10 hours, during which oxygen gas was simultaneously poured into the furnace at a flow rate of 0.5 L/min. Thereafter, a time period of 100 hours was required to gradually lower the temperature in the furnace from 600° C. to 300° C. Moreover, a time period of 10 hours was spent in lowering the temperature in the furnace from 300° C. to room temperature. Thus, a sample of a superconductor was produced.

Then, the sample of the superconductor, which was obtained in the aforementioned manner, was cut. Further, when a section of the sample was observed by using a scanning electron microscope, it was found that few microcracks were caused and that fine particles of the $Sm_2BaCuO_5$ phase, which had diameters of 0.1 to 30 $\mu$m, and fine Ag particles of diameters ranging from 0.1 to 100 $\mu$m were dispersed in a crystal of the $SmBa_2Cu_3O_{7-x}$ phase. Furthermore, it was found that the entire sample reflected the seed crystal and was oriented in the direction of the c-axis, that the difference in crystal orientation between each pair of adjacent crystals was within a range of (−5°) to (+5°) and that this superconductor sample was substantially single crystal.

Further, when the critical temperature (Tc) of each of the obtained superconductive samples was measured, the obtained value thereof was 92 K. Furthermore, when the critical current density (Jc) of each of the superconductive samples was measured at a temperature of 77 [K] in an external magnetic field 1 [T], the measurement value was $2.5 \times 10^4$ A/cm$^2$.

Moreover. the magnetic repulsion force between each superconductive sample and a magnet (that had the maximum surface magnetic flux density of 0.53 [T] and had an outside diameter of 25 mm and was 50 mm in thickness), which is an important feature for application thereof, was measured. Consequently, it was found that the samples exhibited strong magnetic repulsion force (characteristics) of 14 Kg.f in the case where the measurement temperature was 77 [K] and the (measurement) interval was 0.1 mm.

Furthermore, results of the measurement of the critical temperature, the critical current density and the magnetic repulsion force of Example 3 are shown in FIG. 5.

EXAMPLE 4

In the case of this example, briefly, Nd was used as RE of the RE compound composing a raw material mixture for forming an oxide superconductor. Further, crystallization was performed at the partial pressure of oxygen $PO_2=1\times10^{-2}$ atm by further adding 15 wt % of Ag powder to the raw material mixture.

First, after weighing powdery raw materials, namely, $Nd_2O_3$ powder, $BaCO_3$ powder and CuO powder so that the composition ratio Nd:Ba:Cu was 1.8:2.4:3.4, only $BaCO_3$ powder and CuO powder were burned in a platinum crucible at a temperature of 880° C. for two hours. Thus, calcined powder containing $BaCuO_2$ and CuO was obtained (in a mole ratio of $BaCuO_2$ to CuO, which was 2.4:1.0). Subsequently, preliminarily weighed $Nd_2O_3$ powder, 0.5 wt % of Pt powder and 10 wt % of Ag powder were added to and mixed with this calcined powder. Then, this powdery mixture was pulverized by using a pot mill, so that mixture powder, whose mean particle diameter was about 3 $\mu$m, was produced. Subsequently, this pulverized mixture powder was press-molded into a disk-like compact which was 50 mm in outer diameter and was 20 mm in thickness and was a raw material mixture for forming a superconductor.

Next, this compact was put on an alumina substrate and was then put into a semi-melted state by being heated to a temperature of 1130° C. at the partial pressure of oxygen $PO_2=1\times10^{-2}$ atm in the air. Thereafter, the temperature of the compacts was lowered to a temperature of 1030° C. at a rate of 10° C./cm by vertically imposing a temperature gradient of 5° C./cm onto each of the compacts in such a way that the upper part of each of the compacts was at a lower temperature side. Then, a preliminarily produced seed crystal, which contained no Ag and was obtained by dispersing particles of a $Nd_4Ba_2Cu_2O_{10}$ phase in a $NdBa_2Cu_3O_{7-x}$ phase in a composition ratio of the former to the latter=1:0.2, was brought into contact with an upper part of each of the compacts in such a manner that the direction of growth of the seed crystal was parallel with the c-axis. Next, the temperature of the compact was gradually lowered at a rate of 1° C./hr to a temperature of 900° C. Furthermore. the temperature of the compacts was lowered at a rate of 1° C./hr to room temperature. Thus, the crystallization was performed.

Subsequently, the crystallized compact was placed in a furnace being capable of performing inert gas replacement. Then, the inner pressure of the furnace was reduced by a rotary pump to a pressure of 0.1 Torr. Thence, oxygen gas was poured into the furnace, so that the inner pressure of the furnace was equal to an atmospheric pressure and that the partial pressure of oxygen was 95% or more of the inner pressure of the furnace. Thereafter, the temperature in the furnace was raised from room temperature to a temperature of 600° C. over a time period of 10 hours, during which oxygen gas was simultaneously poured into the furnace at a flow rate of 0.5 L/min. Then, a time period of 100 hours was spent in gradually cooling the furnace by lowering the temperature from 600° C. to 300° C. Subsequently, a time period of 10 hours was spent in lowering the temperature in the furnace from 300° C. to room temperature. Thus, a sample of a superconductor was produced.

Then, the sample of the superconductor, which was obtained in the aforementioned manner, was cut. Further, when a section of the sample was observed by using a scanning electron microscope, it was found that fine particles of the $Nd_4Ba_2Cu_2O_{10}$ phase, which had particle diameters of 0.1 to 30 $\mu$m, and fine Ag particles, whose diameters of 0.1 to 100 $\mu$m, were dispersed in a crystal of the $NdBa_2Cu_3O_{7-x}$ phase, and that few microcracks were caused therein. Moreover, it was found that this superconductor sample reflected the seed crystal and was oriented in the direction of the c-axis, that the difference in crystal orientation between each pair of adjoining crystals was within a range of (−5°) to (+5°) and that this superconductor sample was substantially single crystal.

Further, when the critical temperature (Tc) of each of the obtained superconductive samples was measured, the obtained value thereof was 94 K. Furthermore, when the critical current density (Jc) of each of the superconductive samples was measured at a temperature of 77 [K] in an external magnetic field 1 [T], the measurement value was $2.6 \times 10^4$ A/cm$^2$.

Moreover, the magnetic repulsion force between each superconductive sample and a magnet (that had the maximum surface magnetic flux density of 0.53 [T] and had an outside diameter of 25 mm and was 50 mm in thickness), which is an important feature for application thereof, was measured. Consequently, it was found that the samples exhibited strong magnetic repulsion force (characteristics) of 14 Kg.f in the case where the measurement temperature was 77 [K] and the (measurement) interval was 0.1 mm.

Furthermore. results of the measurement of the critical temperature, the critical current density and the magnetic repulsion force of Example 4 are shown in FIG. 5.

COMPARATIVE EXAMPLE 1

Next, a superconductor sample, in which Y was used as RE of the RE compound composing a raw material mixture for forming an oxide superconductor. Further, crystallization was performed in the air without adding Ag thereto. Such a superconductor sample will be described hereinbelow as a "Comparative Example 1".

First, after weighing powdery raw materials, namely, $Y_2O_3$ powder, $BaCO_3$ powder and CuO powder so that the Decomposition ratio Y:Ba:Cu was 18:24:34, these raw materials were mixed with one another and further were molten in a platinum crucible at a temperature of 1400° C. for 30 minutes. Then, the molten materials were solidified by performing the casting thereof onto a copper plate and the quenching thereof. Subsequently, this solidified or coagulated materials were pulverized into powder by using a pot mill, so that the mean particle diameter of the powder was about 2 $\mu$m. Then, this pulverized mixture powder was press-molded into a disk-like compact which was 50 mm in outer diameter and was 20 mm in thickness and was a raw material mixture for forming a superconductor.

Subsequently, this compact was put on an alumina substrate and was then put into a semi-melted state by being heated to a temperature (zone) of 1130° C. in the air. Thereafter, the temperature of the compact was lowered to a temperature of 1000° C. at a rate of 1° C./hr by vertically imposing a temperature gradient of 5° C./cm onto each of the compacts in such a way that the upper part of each of the compacts was at a lower temperature side. Then, a preliminarily produced seed crystal, which contained no Ag and was obtained by dispersing particles of a $Y_2BaCuO_5$ phase in a $YBa_2Cu_3O_{7-x}$ phase in a composition ratio of the former to the latter=1:0.4, was brought into contact with an upper part of each of the compacts in such a manner that the direction of growth of the seed crystal was parallel with the c-axis. Next, the temperature of the compact was gradually lowered at a rate of 1° C./hr to a temperature of 850° C. Furthermore, the temperature of the compacts was lowered at a rate of 1° C./hr to room temperature. Thus, the crystallization was performed.

Subsequently, the crystallized compact was placed in a furnace being capable of performing inert gas replacement. Then, the inner pressure of the furnace was reduced by a rotary pump to a pressure of 0.1 Torr. Thence, oxygen gas was poured into the furnace, so that the inner pressure of the furnace was equal to an atmospheric pressure and that the partial pressure of oxygen was 95% or more of the inner pressure of the furnace. Thereafter, the temperature in the furnace was raised from room temperature to a temperature of 600° C. over a time period of 10 hours, during which oxygen gas was simultaneously poured into the furnace at a flow rate of 0.5 L/min. Then, a time period of 100 hours was spent in gradually cooling the furnace by lowering the temperature from 600° C. to 300° C. Subsequently, a time period of 10 hours was spent in lowering the temperature in the furnace from 300° C. to room temperature. Thus, a sample of a superconductor was produced.

Then, the sample of the superconductor, which was obtained in the aforementioned manner, was cut. Further, when a section of the sample was observed by using a scanning electron microscope, it was found that fine particles of the $Y_2BaCuO_5$ phase, which had particle diameters of 0.1 to 30 $\mu$m, and fine Ag particles, whose diameters of 0.1 to 100 $\mu$m, were dispersed in a crystal of the $YBa_2Cu_3O_{7-x}$ phase. Moreover, it was found that this superconductor sample reflected the seed crystal and was oriented in the direction of the c-axis, that the difference in crystal orientation between each pair of adjoining crystals was within a range of (−5°) to (+5°) and that this superconductor sample was substantially single crystal. However, a few microcracks were caused in this superconductor sample.

Further, when the critical temperature (Tc) of each of the obtained superconductive samples was measured, the obtained value thereof was 90 K. Furthermore, when the critical current density (Jc) of each of the superconductive samples was measured at a temperature of 77 [K] in an external magnetic field 1 [T], the measurement value was 1.7×10$^4$ A/cm$^2$.

Moreover, the magnetic repulsion force acting between each superconductive sample and a magnet (that had the maximum surface magnetic flux density of 0.53 [T] and had an outside diameter of 25 mm and was 50 mm in thickness), which is an important feature for application thereof, was measured. Consequently, it was found that the samples exhibited a magnetic repulsion force of 9 Kg.f in the case where the measurement temperature was 77 [K] and the (measurement) interval was 0.1 mm.

Furthermore. results of the measurement of the critical temperature, the critical current density and the magnetic repulsion force of Comparative Example 1 are shown in FIG. 5.

COMPARATIVE EXAMPLE 2

Next, a superconductor sample, in which Sm was used as RE of the RE compound composing a raw material mixture for forming an oxide superconductor. Further, crystallization was performed at the partial pressure of oxygen $PO_2$=1×10$^{-2}$ atm without adding Ag thereto. Such a superconductor sample will be described hereinbelow as a "Comparative Example 2".

First, after weighing powdery raw materials, namely, $Sm_2O_3$ powder, $BaCO_3$ powder and CuO powder so that the composition ratio Sm:Ba:Cu was 1.8:2.4:3.4, only $BaCO_3$ powder and CuO powder were burned in a platinum crucible at a temperature of 880° C. for thirty minutes. Thus, calcined powder containing $BaCuO_2$ and CuO was obtained (in a mole ratio of $BaCuO_2$ to CuO, which was 2.4:1.0). Subsequently, this calcined powder was pulverized by using a pot mill, so that the mean particle diameter of the mixture powder was about 3 $\mu$m. Then, the pulverized powder was mixed with $Sm_2O_3$ powder, which was preliminarily weighted, and with 0.5 wt % of Pt powder were added to and were mixed with this calcined powder. Subsequently, this pulverized mixture powder was press-molded into a disk-like compact which was 50 mm in outer diameter and was 20 mm in thickness and was a raw material mixture for forming a superconductor.

Next, this compact was put on an alumina substrate and was then put into a semi-melted state by being heated to a temperature (zone) of 1150° C. at the partial pressure of oxygen $PO_2$=1×10$^{-2}$ atm. Thereafter, the temperature of the compact was lowered to a temperature of 1060° C. at a rate of 10° C./min by vertically imposing a temperature gradient of 5° C./cm onto each of the compacts in such a way that the upper part of each of the compacts was at a lower temperature side. Then, a preliminarily produced seed crystal, which contained no Ag and was obtained by dispersing particles of a $Nd_4Ba_2Cu_2O_{10}$ phase in a $NdBa_2Cu_3O_{7-x}$ phase in a composition ratio of the former to the latter=1:0.2, was brought into contact with an upper part of each of the compacts in such a manner that the direction of growth of the seed crystal was parallel with the c-axis. Next, the temperature of the compact was gradually lowered at a rate of 1° C./hr to a temperature of 900° C. Furthermore, the temperature of the compacts was lowered at a rate of 10° C./hr therefrom to room temperature. Thus, the crystallization was performed.

Then, the crystallized compact was placed in a furnace being capable of performing inert gas replacement. Subsequently, the inner pressure of the furnace was reduced by a rotary pump to a pressure of 0.1 Torr. Thence, oxygen gas was poured into the furnace, so that the inner pressure of the furnace was equal to an atmospheric pressure and that the partial pressure of oxygen was 95% or more of the inner pressure of the furnace. Thereafter, the temperature in the furnace was raised from room temperature to a temperature of 600° C. over a time period of 10 hours. during which oxygen gas was simultaneously poured into the furnace at a flow rate of 0.5 L/min. Then, a time period of 100 hours was spent in gradually cooling the furnace by lowering the temperature from 600° C. to 300° C. Subsequently, a time period of 10 hours was spent in lowing the temperature in the furnace from 300° C. to room temperature. Thus, a sample of a superconductor was produced.

Then, the sample of the superconductor, which was obtained in the aforementioned manner, was cut. Further, when a section of the sample was observed by using a scanning electron microscope, it was found that fine particles of the $Sm_2BaCuO_3$ phase, which had particle diameters of 0.1 to 30 μm, were dispersed in a crystal of the $SmBa_2Cu_3O_{7-x}$ phase. However, the difference in formation temperature between a Nd—Ba—Cu—O "123 phase" and Sm—Ba—Cu—O "123 phase" was small or low, namely. 10° C., so that the seed crystal was molten and the superconductor sample was a polycrystalline substance.

Further, when the critical temperature (Tc) of each of the obtained superconductive samples was measured, the obtained value thereof was 92 K. Furthermore, when the critical current density (Jc) of each of the superconductive samples was measured at a temperature of 77 [K] in an external magnetic field 1 [T], the measurement value was $2.0 \times 10^4$ A/cm$^2$.

However, the magnetic repulsion force acting between each superconductive sample and a magnet (that had the maximum surface magnetic flux density of 0.53 [T] and had an outside diameter of 25 mm and was 50 mm in thickness), which is an important feature for application thereof, was measured. Consequently, it was found that the samples exhibited a low magnetic repulsion force, namely, a magnetic repulsion force of 5 Kg.f in the case where the measurement temperature was 77 [K] and the (measurement) interval was 0.1 mm.

Furthermore, results of the measurement of the critical temperature, the critical current density and the magnetic repulsion force of "Comparative Example 2" are shown in FIG. 5.

Incidentally, the aforementioned Examples (or embodiments of the present invention) used Y, Nd and Sm as RE, respectively. However, it was confirmed that superconductors manufactured by methods, which used other rare earth elements, had characteristics similar to those of the aforementioned embodiments of the present invention.

Additionally. in the case of the aforementioned embodiments of the present invention, the metallic powder of the following kinds, namely, Pt powder, Pd powder, Ru powder, Rh powder, Ir powder, Os powder and Re powder were used. However, it was confirmed that oxide superconductors manufactured by adding compounds containing such elements to the materials thereof had similar characteristics.

Although the preferred embodiments of the present invention have been described above, it should be understood that the present invention is not limited thereto and that other modifications will be apparent to those skilled in the art without departing from the spirit of the invention.

The scope of the present invention, therefore, is to be determined solely by the appended claims.

What is claimed is:

1. An oxide superconductor manufacturing method of manufacturing a RE—Ba—Cu—O oxide superconductor (said RE is one or more of Dy, Gd, Eu, Sm and Nd) by performing a treatment, which includes at least a burning process performed in a range of temperatures that are higher than a melting point of a raw material mixture comprising an RE-compound, a Ba-compound and a Cu-compound, on said raw material mixture, and said oxide superconductor manufacturing method comprising:

an addition step of adding from 1 wt % to 30 wt % of metal Ag or a Ag-compound to said raw material mixture (in case of adding said Ag-compound, the additional amount is indicated by the element weight of only said metal Ag); and a crystallization step of melting said raw material mixture, to which said metal Ag or said Ag-compound is added, at a temperature that is not lower than a temperature at which said raw material mixture is decomposed and fused into a $RE_2BaCuO_5$ phase and a liquid phase, and then lowering the temperature of said raw material mixture to a temperature close to a temperature at which a $RE_1Ba_2Cu_3O_{7-x}$ phase crystallizes, and subsequently bringing a seed crystal which meets the condition:

(a crystallized temperature of a $RE_1Ba_2Cu_3O_{7-x}$ phase of the seed crystal)>(a crystallized temperature of the $RE_1Ba_2Cu_3O_{7-x}$ phase of said raw material mixture to which said metal Ag or said Ag-compound is added), into contact with said raw material mixture, and then performing crystallization by using the seed crystal as a starting point of crystallization.

2. The oxide superconductor manufacturing method according to claim 1, wherein either:

(i) one or more of the metals Pt, Pd, Ru, Rh, Ir, Os and Re;

(ii) one or more compounds containing one or more of said metals Pt, Pd, Ru, Rh, Ir, Os and Re; or (iii) one or more of said metals Pt, Pd, Ru, Rh, Ir, Os and Re and said one or more compounds containing one or more of said metals Pt, Pd, Ru, Rh, Ir, Os and Re;

are added to said raw material mixture in an amount of from 0.05 wt % to 5 wt % (in case of adding said one or more compounds containing one or more of said metals Pt, Pd, Ru, Rh, Ir, Os and Re, the additional amount is indicated by the element weight of only said one or more of said metals Pt, Pd, Ru, Rh, Ir, Os and Re.

3. The oxide superconductor manufacturing method according to claim 2, wherein a partial pressure of oxygen is set at $1 \times 10^{-4}$ atm to $2 \times 10^{-1}$ atm in said crystallization step.

4. The oxide superconductor manufacturing method according to claim 1, wherein a partial pressure of oxygen is set at $1 \times 10^{-4}$ atm to $2 \times 10^{-1}$ atm in said crystallization step.

* * * * *

UNITED STATES PATENT AND TRADEMARK OFFICE
CERTIFICATE OF CORRECTION

PATENT NO. : 6,103,670
DATED : August 15, 2000
INVENTOR(S) : Shuichi Kohayashi; Shuetsu Haseyama; Shuji Yoshizawa; Shigeo Nagaya It is certified that error appears in the above-identified patent and that said Letters Patent is hereby corrected as shown below:

Claim 2, line 15, change "Re" to --Re)--.

Signed and Sealed this

First Day of May, 2001

*Attest:*

NICHOLAS P. GODICI

*Attesting Officer*         *Acting Director of the United States Patent and Trademark Office*